(12) United States Patent
Javorka et al.

(10) Patent No.: US 9,406,565 B2
(45) Date of Patent: Aug. 2, 2016

(54) METHODS FOR FABRICATING INTEGRATED CIRCUITS WITH SEMICONDUCTOR SUBSTRATE PROTECTION

(71) Applicant: GLOBALFOUNDRIES, Inc., Grand Cayman (KY)

(72) Inventors: Peter Javorka, Radeburg (DE); Ralf Richter, Radebeul (DE); Jan Hoentschel, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 13/842,077

(22) Filed: Mar. 15, 2013

(65) Prior Publication Data
US 2014/0273375 A1 Sep. 18, 2014

(51) Int. Cl.
*H01L 21/8234* (2006.01)
*H01L 21/266* (2006.01)
*H01L 21/8238* (2006.01)
*H01L 21/265* (2006.01)
*H01L 29/66* (2006.01)

(52) U.S. Cl.
CPC .. *H01L 21/823418* (2013.01); *H01L 21/26513* (2013.01); *H01L 21/823412* (2013.01); *H01L 21/823807* (2013.01); *H01L 21/823814* (2013.01); *H01L 21/26586* (2013.01); *H01L 29/6656* (2013.01)

(58) Field of Classification Search
CPC ... H01L 21/266; H01L 21/8234; H01L 29/66; H01L 21/823418
USPC .......................................................... 438/275
See application file for complete search history.

(56) References Cited

U.S. PATENT DOCUMENTS

| | | | |
|---|---|---|---|
| 2002/0102430 A1* | 8/2002 | Shirahata | H01L 21/28247 428/629 |
| 2003/0194849 A1* | 10/2003 | Johnson et al. | 438/510 |
| 2005/0218455 A1* | 10/2005 | Maeda et al. | 257/368 |
| 2008/0153273 A1* | 6/2008 | Kirmse et al. | 438/514 |
| 2008/0293207 A1* | 11/2008 | Koutny et al. | 438/306 |
| 2008/0296631 A1* | 12/2008 | Chen | H01L 21/823807 257/254 |
| 2011/0237039 A1* | 9/2011 | Yang et al. | 438/285 |
| 2012/0273880 A1* | 11/2012 | Teng et al. | 257/336 |

\* cited by examiner

*Primary Examiner* — Christine Enad
(74) *Attorney, Agent, or Firm* — Ingrassia Fisher & Lorenz, P.C.

(57) ABSTRACT

Methods for fabricating an integrated circuit are provided herein. In an embodiment, a method for fabricating an integrated circuit includes forming a gate electrode structure overlying a semiconductor substrate. A first sacrificial oxide layer is formed overlying the semiconductor substrate and a first implant mask is patterned overlying the first sacrificial oxide layer to expose a portion of the first sacrificial oxide layer adjacent the gate electrode structure. Conductivity determining ions are implanted into the semiconductor substrate, through the first sacrificial oxide layer. The first implant mask and the first sacrificial oxide layer are removed after implanting the conductivity determining ions into the semiconductor substrate.

18 Claims, 3 Drawing Sheets

METHODS FOR FABRICATING INTEGRATED CIRCUITS WITH SEMICONDUCTOR SUBSTRATE PROTECTION

TECHNICAL FIELD

The technical field generally relates to methods for fabricating integrated circuits, and more particularly relates to methods for fabricating integrated circuits with a surface of a semiconductor substrate in the integrated circuit protected during fabrication.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

As advanced metal-oxide-semiconductor (MOS) technology continues to scale and move into the deep-sub-micron geometry dimensions, the optimization of source/drain regions has become complex. Conventional techniques that are employed to form the source region and the drain region often result in poor topology in a surface of the semiconductor substrate and, in particular, in surfaces of the source region and the drain region. Poor topology of the semiconductor substrate affects formation of subsequent features that overlie the semiconductor substrate and can lead to void formation, which may ultimately result in device failure. Cycles of medium to high dose ion implantation are often used to form the source region and the drain region, as well as various extension regions for the source region and the drain region. Each cycle of ion implantation is generally accompanied by patterning of a mask to limit ion implantation to desired regions of the semiconductor substrate, followed by stripping the mask and cleaning the semiconductor substrate after each ion implantation. However, it is believed that stripping the mask and cleaning the semiconductor substrate adversely impacts the surface topology of the semiconductor substrate by removing material therefrom. The adverse impact on the surface topology of the semiconductor substrate is compounded by numerous ion implantations. In this regard, the adverse impact on surface topology is particularly pronounced for multi-voltage threshold devices, which have been developed to include transistors and other devices on the semiconductor substrate that have different threshold voltages. The multi-voltage threshold devices are useful to increase performance without an increase in power requirements and are generally formed using varying degrees of ion implantation to form the source region and the drain region. Low, moderate or regular, and highly doped source regions and drain regions are formed depending upon whether a particular transistor is to have a high voltage threshold, a moderate voltage threshold, or a low voltage threshold within the multi-voltage threshold device. Formation of the low, moderate or regular, and highly doped source regions and drain regions, as well as formation of extension regions for the source region and the drain region, generally require separate masking, ion implantation, mask stripping, and substrate cleaning, thereby impacting topology of the semiconductor substrate as described above.

Accordingly, it is desirable to provide methods of forming semiconductor devices with minimized damage to semiconductor substrate surfaces resulting from mask stripping and substrate cleaning after ion implantation. It is also desirable to provide such methods that minimize damage to the semiconductor substrate surfaces even when numerous cycles of masking, ion implantation, mask stripping and substrate cleaning are employed. Furthermore, other desirable features and characteristics of the present invention will become apparent from the subsequent detailed description of the invention and the appended claims, taken in conjunction with the accompanying drawings and this background of the invention.

BRIEF SUMMARY

Methods for fabricating an integrated circuit are provided herein. In an embodiment, a method for fabricating an integrated circuit includes forming a gate electrode structure overlying a semiconductor substrate. A first sacrificial oxide layer is formed overlying the semiconductor substrate and a first implant mask is patterned overlying the first sacrificial oxide layer to expose a portion of the first sacrificial oxide layer adjacent the gate electrode structure. Conductivity determining ions are implanted into the semiconductor substrate, through the first sacrificial oxide layer. The first implant mask and the first sacrificial oxide layer are removed after implanting the conductivity determining ions into the semiconductor substrate.

In another embodiment, a method for fabricating an integrated circuit includes forming a plurality of gate electrode structures overlying a semiconductor substrate. A first sacrificial oxide layer is formed overlying the semiconductor substrate and a first implant mask is patterned overlying the first sacrificial oxide layer and a portion of the gate electrode structures to expose a portion of the first sacrificial oxide layer adjacent the gate electrode structures after forming the first sacrificial oxide layer. Patterning the first implant mask results in masked gate electrode structures and unmasked gate electrode structures. Conductivity determining ions are implanted into the semiconductor substrate, through the first sacrificial oxide layer. The first implant mask is removed after implanting the conductivity determining ions into the semiconductor substrate, and the first sacrificial oxide layer is removed after implanting the conductivity determining ions into the semiconductor substrate. A second sacrificial oxide layer is formed overlying the semiconductor substrate after removing the first sacrificial oxide layer, and a second implant mask is patterned overlying the second sacrificial oxide layer and overlying unmasked gate electrode structures left exposed after patterning the first implant mask. Conductivity determining ions are implanted into the semiconductor substrate, through the second sacrificial oxide layer. An additional implant mask is patterned overlying one of the first sacrificial oxide layer or the second sacrificial oxide layer after removing the first implant mask or the second implant mask. The additional implant mask is formed overlying unmasked gate electrode structures left exposed by the first implant mask and the second implant mask.

In another embodiment, a method for fabricating an integrated circuit includes forming a plurality of gate electrode structures overlying a semiconductor substrate. The plurality of gate electrode structures includes N-type gate electrode structures and P-type gate electrode structures. A portion of the gate electrode structures are selectively masked with an epitaxy mask to produce masked N-type gate electrode structures and unmasked P-type gate electrode structures. Trenches are etched adjacent the unmasked P-type gate electrode structures, and the trenches are filled with an epitaxially-grown semiconductor material. The epitaxy mask is removed after epitaxially growing the semiconductor material to expose the N-type gate electrode structures. A first sacrificial oxide layer is formed overlying the semiconductor substrate after removing the epitaxy mask, and a first implant mask is patterned overlying the first sacrificial oxide layer and the N-type gate electrode structures to expose a portion of the first sacrificial oxide layer adjacent the P-type gate electrode structures after forming the first sacrificial oxide layer. Patterning the first implant mask produces masked N-type gate electrode structures and unmasked P-type gate electrode structures. P-type conductivity determining ions are implanted into the semiconductor substrate, through the first sacrificial oxide layer. The first implant mask is removed after implanting the P-type conductivity determining ions into the semiconductor substrate. The first sacrificial oxide layer is removed after implanting the P-type conductivity determining ions into the semiconductor substrate, and a second sacrificial oxide layer is formed overlying the semiconductor substrate after removing the first sacrificial oxide layer. A second implant mask is patterned overlying the second sacrificial oxide layer and overlying unmasked P-type gate electrode structures left exposed after patterning the first implant mask. N-type conductivity determining ions are implanted into the semiconductor substrate, through the second sacrificial oxide layer.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
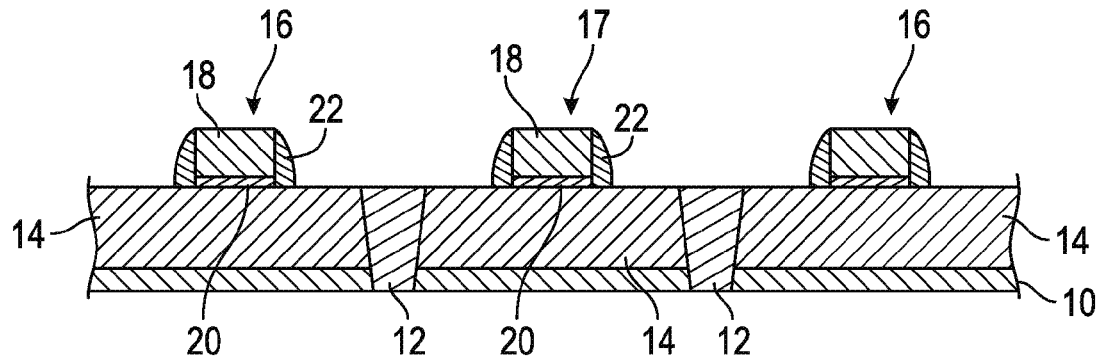
FIGS. 1-8 illustrate, in cross section, a method for fabricating a portion of an integrated circuit in accordance with an exemplary embodiment.

The following detailed description is merely exemplary in nature and is not intended to limit the various embodiments or the application and uses thereof. Furthermore, there is no intention to be bound by any theory presented in the preceding background or the following detailed description.

Methods for fabricating integrated circuits are provided herein. In particular, the integrated circuits formed in accordance with the methods that are described herein include a semiconductor substrate, a source region and a drain region disposed in the semiconductor substrate, a channel region defined between the source region and the drain region in the semiconductor substrate, a gate dielectric layer overlying the channel region, and a gate electrode structure overlying the gate dielectric layer.

Without being bound by any particular theory, it is believed that conventional techniques that are employed to form the source region and the drain region result in poor topology in a surface of the semiconductor substrate and, in particular, in surfaces of the source region and the drain region. Cycles of ion implantation are generally used to form the source region and the drain region, as well as various extension regions as described in further detail below. Each cycle of ion implantation is generally accompanied by deposition of a mask to limit ion implantation to desired regions of the semiconductor substrate, followed by stripping the mask and cleaning the semiconductor substrate after each ion implantation. In accordance with the various embodiments of the method contemplated herein, and as described in further detail below, a first sacrificial oxide layer is formed overlying the semiconductor substrate prior to at least some of the ion implantation cycles, with the ions implanted through the first sacrificial oxide layer into the semiconductor substrate. As referred to herein the "sacrificial oxide layer" is a layer that is formed from an oxide, such as silicon dioxide, that is present during certain fabrication techniques to protect the surface of the semiconductor substrate from harsh stripping and cleaning conditions, and that is ultimately absent from the integrated circuit after fabrication. The sacrificial oxide layer inhibits material removal from the surface of the semiconductor substrate while the mask is stripped and the semiconductor substrate is cleaned, thereby minimizing an adverse impact on the surface topology of the semiconductor substrate. Additional sacrificial oxide layers may be formed overlying the semiconductor substrate upon removal of the first sacrificial oxide layer, although the first sacrificial oxide layer may still be present on the semiconductor substrate after numerous cycles of masking, ion implantation, mask stripping, and substrate cleaning. Any sacrificial oxide layers are generally removed prior to silicidation of the source region and the drain region, and the resulting integrated circuit exhibits excellent surface topology as a result of use of the sacrificial oxide layer.

An exemplary method of forming a semiconductor device will now be described with reference to FIGS. 1-8. Referring to FIG. 1, a semiconductor substrate 10 including a first semiconductor material is provided. The first semiconductor material may be any semiconductor material that is known for industrial use in electronic devices. Examples of the first semiconductor material include, but are not limited to, those chosen from silicon, silicon germanium (SiGe), germanium (Ge), gallium arsenide (GaAs), or indium phosphide (InP). For example, in an embodiment, the first semiconductor material is silicon, and the silicon is present in an amount of from about 95 to about 100 mol %, such as from about 99 to about 100 mol %, based upon the total amount of atoms in the semiconductor substrate 10. The silicon may be substantially pure, i.e., dopants and/or impurities are present in amounts of less than or equal to 1 mol % based upon the total amount of atoms in the semiconductor substrate 10 and are desirably absent from the semiconductor substrate 10.

In an embodiment and as shown in FIG. 1, shallow trench isolation (STI) structures 12 are formed in the semiconductor substrate 10, and wells 14 are formed in the semiconductor substrate 10 through conventional fabrication techniques. The wells 14 have a dopant concentration, or a concentration of conductivity determining ions, and the conductivity determining ions may be a P-type or N-type conductivity determining ions, depending upon whether a PMOS transistor or NMOS transistor is to be formed. Each well 14 contains opposite conductivity determining ions from the source region and drain region that are to be formed therein. For example, when the source region and drain region for a device include P-type conductivity determining ions, the well 14 includes N-type conductivity determining ions, and vice versa. Typical N-type conductivity determining ions include, but are not limited to, phosphorus, arsenic, antimony, and combinations thereof. Typical P-type conductivity determining ions include, but are not limited to, boron, aluminum, gallium, indium, and combinations thereof.

In an embodiment and as also shown in FIG. 1, a gate electrode structure 16 is formed overlying the semiconductor substrate 10. In a particular embodiment and as shown in FIG. 1, a plurality of gate electrode structures 16, 17 are formed overlying the semiconductor substrate 10. For illustrative purposes, FIGS. 1-8 show two gate electrode structures 16 for P-type devices, and one gate electrode structure 17 for an N-type device. As shown in FIG. 1, the gate electrode structures 16, 17 include a gate electrode 18 that overlies a gate dielectric layer 20. The gate electrode structures 16, 17 may be part of a metal-oxide-semiconductor (MOS) transistor device that is formed on the semiconductor substrate 10. Although the term 'MOS transistor device' properly refers to a device having a metal gate electrode and an oxide gate insulator, that term is used herein to refer to any semiconductor device that includes a conductive gate electrode (whether metal or other conductive material) that is positioned overlying a gate insulator (whether oxide or other insulator) which, in turn, is positioned overlying the semiconductor substrate 10. The gate electrode structures 16, 17 may be formed through conventional techniques. The gate dielectric layer 20 may include an insulator material such as, but not limited to, silicon dioxide, silicon oxide, silicon nitride, or the like. The gate electrode 18 may be formed from conventional materials including copper, silver, and doped or undoped polycrystalline silicon. First sidewall spacers 22 are then formed on opposite sides of the gate electrode structure 16 to insulate the gate electrode 18 and to align ion implantation into the semiconductor substrate 10 as described in further detail below.

Figure 2:
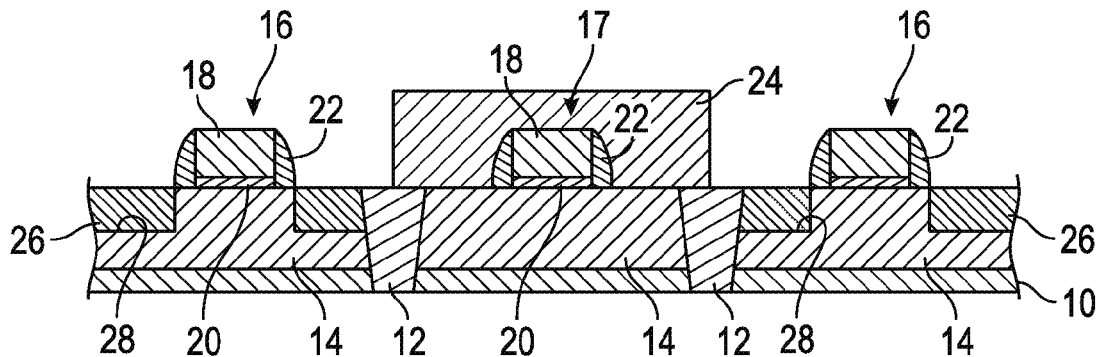

In an embodiment and as shown in FIG. 2, a portion of the gate electrode structures 17 are selectively masked with an epitaxy mask 24 to produce masked gate electrode structures 17 and unmasked gate electrode structures 16. In the embodiment shown, the masked gate electrode structures 17 are N-type structures, and the unmasked gate electrode structures 16 are P-type structures. The epitaxy mask 24 may be formed from any masking material, such as silicon dioxide, and shields the masked N-type gate electrode structures 17 to enable formation of epitaxially-grown semiconductor regions 26 adjacent to the unmasked P-type gate electrode structures 16. In particular, in an embodiment and as also shown in FIG. 2, trenches 28 are etched adjacent to the unmasked p-type gate electrode structures 16, using the spacers 22 as an etch mask. A semiconductor material is epitaxially grown within the trenches 28 on the exposed crystal lattice of the semiconductor substrate 10 to form the epitaxially-grown semiconductor regions 26. The epitaxially-grown semiconductor material may provide compressive stress within the semiconductor substrate 10. For example, when the semiconductor substrate 10 is silicon, the epitaxially-grown semiconductor material may be silicon germanium (SiGe). The epitaxially-grown semiconductor material only forms on exposed areas of semiconductor material of the semiconductor substrate 10, and little to no epitaxially-grown semiconductor material generally forms on the epitaxy mask 24.

Figure 3:
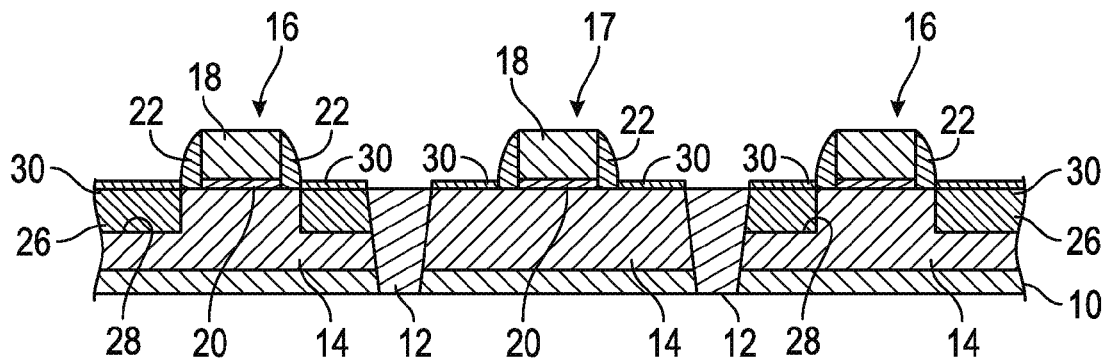

Referring to FIG. 3, the epitaxy mask is removed after epitaxially growing the semiconductor material to expose the N-type gate electrode structures 17, thereby enabling for blanket formation of a first sacrificial oxide layer 30 across the semiconductor substrate 10, including adjacent to both the N-type gate electrode structures 17 and the P-type gate electrode structures 16 prior to ion implantation, as described in further detail below. The first sacrificial oxide layer 30 is generally formed overlying the semiconductor substrate 10. As used herein, the term "overlying" is used to encompass both "over" and "on". In this regard, the first sacrificial oxide layer 30 may overlie the semiconductor substrate 10 such that a material layer, such as another oxide layer, is interposed between layer 30 and substrate 10. Alternatively, first sacrificial oxide layer 30 may be formed directly on a surface of the semiconductor substrate 10. In an embodiment, the first sacrificial oxide layer 30 is formed by thermally oxidizing the surface of the semiconductor substrate 10, thereby forming an oxide in the semiconductor substrate 10 as the first sacrificial oxide layer 30. The first sacrificial oxide layer 30 may be formed in the absence of any patterning techniques, with the oxide only forming on exposed surfaces of the semiconductor substrate 10, as well as on exposed surfaces of the epitaxially-grown semiconductor regions 26. The first sacrificial oxide layer 30 is formed having a thickness that still enables effective ion implantation through the first sacrificial oxide layer 30 but which is also sufficiently thick to provide protection to the surface of the semiconductor substrate 10. For example, in an embodiment, the first sacrificial oxide layer 30 is formed to have a thickness of from about 20 to about 30 Angstroms.

Figure 4:
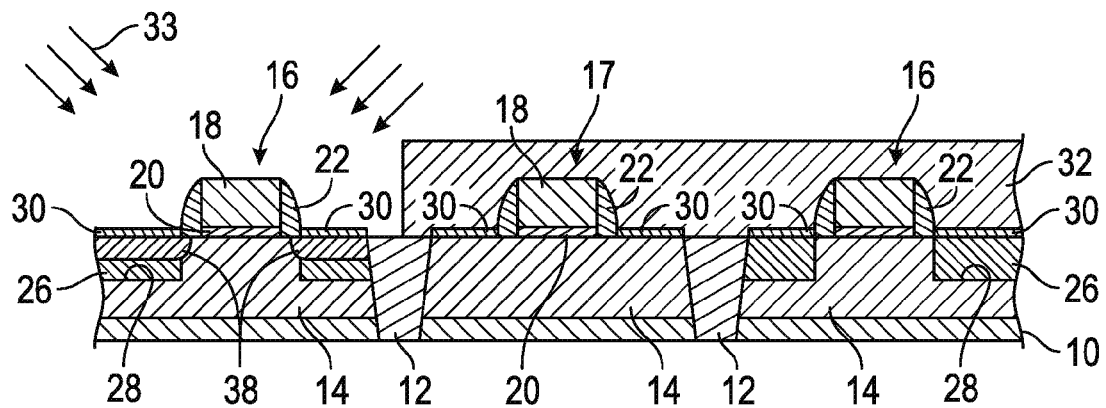

After forming the first sacrificial oxide layer 30, ion implantation is conducted to form a source region 34 and drain region 36 for the various gate electrode structures 16, 17, as well as to form associated halo regions (not shown) and extension regions 38 as desired. To conduct ion implantation, certain gate electrode structures 16, 17 are selectively masked, leaving regions of the first sacrificial oxide layer 30 exposed where ion implantation is desired. Mask removal and substrate cleaning follows ion implantation. Numerous cycles of masking, ion implantation, mask removal, and substrate cleaning may be conducted to form the source region and the drain region for various gate electrode structures 16, 17 and, due to the presence of the first sacrificial oxide layer 30, multiple such cycles may be conducted without materially damaging the surface of the semiconductor substrate 10. In an embodiment and as shown in FIG. 4, a first implant mask 32 is patterned overlying the first sacrificial oxide layer 30 to expose a portion of the first sacrificial oxide layer 30 adjacent to the gate electrode structure 16, where a source region 34 and a drain region 36 are to be formed. In the embodiment shown in FIG. 4, a portion of the gate electrode structures 16, 17 are selectively masked with the first implant mask 32 to produce masked gate electrode structures 16, 17 and unmasked gate electrode structures 16. For example, selective masking is desirable to shield the N-type gate electrode structure 17 from ion implantation that is specific to formation of the source region and the drain region for P-type gate electrode structures 16. Further, in the embodiment shown in FIG. 4, P-type gate electrode structures 16 can be selectively masked to enable formation of P-type gate electrode structures 16 that have different voltage thresholds by modifying an energy level of the ion implantation during formation of the source region and the drain region for different P-type electrode structures 16.

In an embodiment and as also shown in FIG. 4, after forming the first implant mask 32, conductivity determining ions 33 are implanted into the semiconductor substrate 10, through the first sacrificial oxide layer 30. In the embodiment shown in FIG. 4, P-type conductivity determining ions 33 are employed for the ion implantation and, in particular, formation of extension regions 38 for the source region and the drain region of the unmasked gate electrode structure 16 are shown. The conductivity determining ions 33 are implanted in the semiconductor substrate 10 using the gate electrode structure 16 as an ion implantation mask, with ion implantation blocked for masked gate electrode structures 16, 17. While formation of extension regions 38 is shown in FIG. 4, it is to be appreciated that techniques for forming source regions and drain regions are dynamic and that the instant methods do not necessarily require that ions be implanted in any specific configuration in the source region and the drain region.

Figure 5:
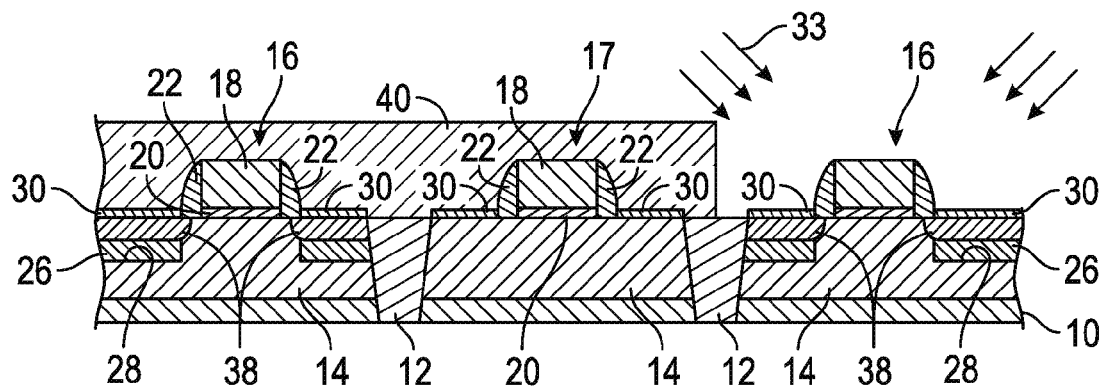

In an embodiment, after ion implantation using the first implant mask is completed, the first implant mask is removed. In embodiments, depending upon severity of mask removal and substrate cleaning techniques, the first sacrificial oxide layer may be removed along with the first implant mask or, alternatively, the first sacrificial oxide layer may remain in place to enable further ion implantation to be conducted. In one specific embodiment and as shown in FIG. 5, the first implant mask is removed and an additional implant mask 40 is formed overlying unmasked gate electrode structures 16 and the gate electrode structure 16 in which the extension regions 38 were formed. In this manner, further ion implantation can be conducted for other gate electrode structures 16 and/or 17. Additionally, in the embodiment shown in FIG. 5, the first sacrificial oxide layer 30 remains in place. However, although not shown, it is to be appreciated that additional sacrificial oxide layers may be formed under circumstances where the first sacrificial oxide layer 30 provides insufficient protection to the surface of the semiconductor substrate 10 or is completely removed. Conductivity determining ions 33 are then implanted into the semiconductor substrate 10, using the additional implant mask 40 to define regions of the semiconductor substrate 10 where ion implantation can occur, in the same manner as described above in the context of FIG. 4. In the particular embodiment shown in FIG. 5, extension regions 38 are formed for gate electrode structures 16 that are unmasked by the additional implant mask 40.

In an embodiment, conductivity determining ions 33 are selectively implanted into the semiconductor substrate 10 at different energy levels for different unmasked gate electrode structures 16. For example, for the embodiments of FIGS. 4 and 5, conductivity determining ions 33 may be implanted into the semiconductor substrate 10 at a first energy level prior to removing the first implant mask, and conductivity determining ions 33 may be implanted into the semiconductor substrate 10 at a second energy level after removing the first implant mask and after forming the additional implant mask 40, prior to removing the first sacrificial oxide layer 30. Such a technique may be useful for forming multi-voltage threshold devices.

While FIGS. 4 and 5 illustrate formation of the first implant mask and the additional implant mask 40, after removal of the first implant mask, it is to be appreciated that further cycles of mask removal and substrate cleaning can be conducted along with formation of further masks to conduct further ion implantation as desired. As described in further detail below, it is also to be appreciated that additional sacrificial oxide layers may be formed on an as-needed basis, depending upon whether sufficient sacrificial oxide remains prior to conducting further ion implantation.

Figure 6:
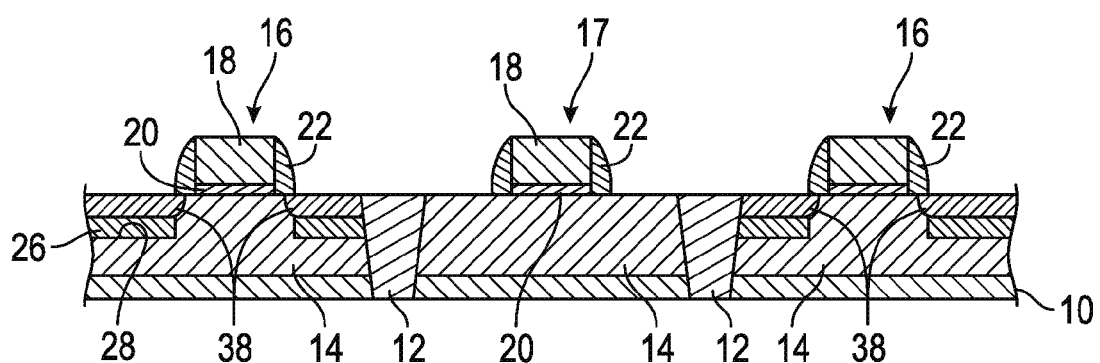

In an embodiment and as shown in FIG. 6, the first sacrificial oxide layer is removed from the surface of the semiconductor substrate 10. The first sacrificial oxide layer may be removed during the course of mask removal and substrate cleaning. Alternatively, the first sacrificial oxide layer may be intentionally removed, such as under circumstances where no further ion implantation is to be conducted. Further still, the first sacrificial oxide layer may be removed for purposes of forming a new sacrificial oxide layer to ensure that the surface of the semiconductor substrate 10 is adequately protected.

Figure 7:
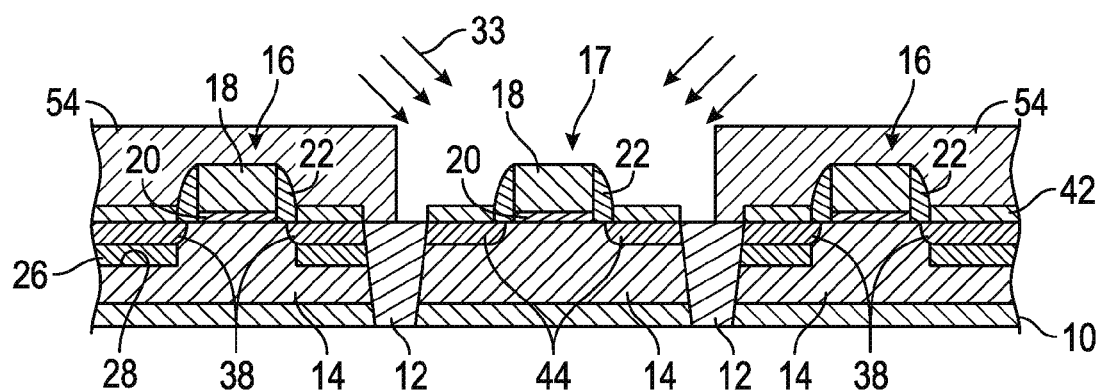

In an embodiment and as shown in FIG. 7, a second sacrificial oxide layer 42 is formed overlying the semiconductor substrate 10 after removing the first sacrificial oxide layer. The second sacrificial oxide layer 42 is optional and is generally only formed under circumstances where the first sacrificial oxide layer is removed or not sufficient for full protection, as set forth above, and where the surface of the semiconductor substrate 10 benefits from further protection, such as when further masking, ion implantation, mask removal, and substrate cleaning is to be conducted. In the embodiment shown in FIG. 7, a second implant mask 54 is formed overlying the second sacrificial oxide layer 42 and overlying unmasked gate electrode structures 16 that are left exposed after patterning the first implant mask 32 and the additional implant mask 40 as described above. However, it is to be appreciated that the second implant mask 54 may be formed in any configuration to leave certain gate electrode structures 16, 17 unmasked as desired based upon a particular ion implantation result to be achieved. For purposes of the embodiment shown in FIG. 7, the unmasked gate electrode structure 17 is an N-type gate electrode structure 17, and ion implantation is shown to form extension regions 44 for the N-type gate electrode structures 17. Conductivity determining ions 33 are implanted into the semiconductor substrate 10, through the second sacrificial oxide layer 42, in the same manner as described above in the context of FIG. 4. In this embodiment, N-type conductivity determining ions 33 are implanted into the semiconductor substrate 10. However, it is to be appreciated that order of masking and ion implantation for N-type gate electrode structures 17 and P-type gate electrode structures 16 is not particularly limited. After ion implantation using the second implant mask 54, mask removal and substrate cleaning may be conducted as described above.

Figure 8:
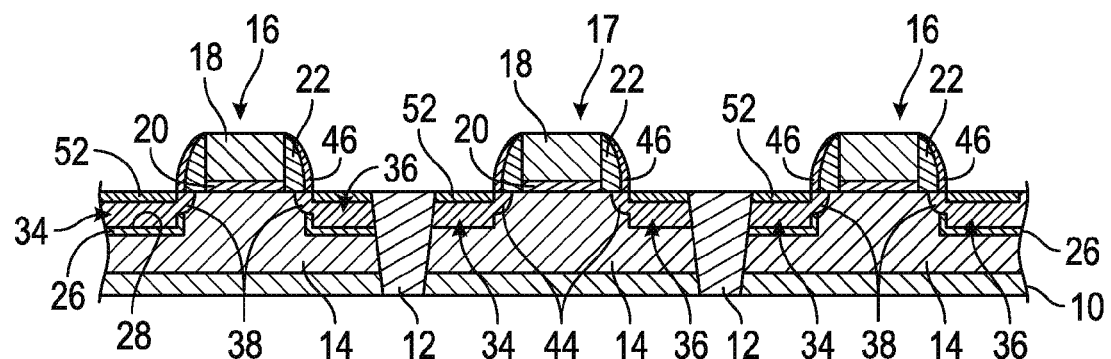

Although not shown in the Figures, in various embodiments an additional implant mask may be patterned overlying the second sacrificial oxide layer 42 after removing the second implant mask. The additional implant mask may be formed and employed for further ion implantation into the semiconductor substrate 10 in the same manner as the additional implant mask 40 that is formed overlying the first sacrificial oxide layer 30 and that is described above with reference to FIG. 5. It is to be appreciated that forming the additional implant masks, either overlying the first sacrificial oxide layer 30 or the second sacrificial oxide layer 42, is optional and depends upon particular ion implantation considerations. FIG. 8 illustrates source regions 34 and drain regions 36 formed for all of the gate electrode structures 16, 17 after ion implantation, with primary spacers 46 formed to define a configuration of the source region 34 and the drain region 36 during ion implantation.

In an embodiment and as shown in FIG. 8, after completing ion implantation, the second sacrificial oxide layer is removed along with the second implant mask and any other implant masks that may be formed to conduct ion implantation. A silicide layer 52 may be formed in the source regions 34 and drain regions 36. The silicide layer 52 is generally disposed overlying the source region 34 and the drain region 36 to facilitate electrical connection to the source region 34 and the drain region 36 with electrical interconnects (not shown). Although not shown, further structure may then be formed overlying the gate electrode structures 16, 17, silicide layer 52, and semiconductor substrate 10 in accordance with conventional integrated circuit fabrication.

While at least one exemplary embodiment has been presented in the foregoing detailed description of the invention, it should be appreciated that a vast number of variations exist.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit comprising:
    forming a gate electrode structure overlying a semiconductor substrate;
    forming sidewall spacers on opposite sides of the gate electrode structure;
    thermally oxidizing a surface of the semiconductor substrate to form a first sacrificial oxide layer overlying the semiconductor substrate, wherein the first sacrificial oxide layer is formed after forming the gate electrode structure and after forming the sidewall spacers, and wherein the sacrificial layer is only formed on the surface of the semiconductor substrate or epitaxially-formed semiconductor regions formed therein;
    patterning a first implant mask overlying the first sacrificial oxide layer to expose a portion of the first sacrificial oxide layer adjacent the gate electrode structure;
    implanting conductivity determining ions into the semiconductor substrate, through the first sacrificial oxide layer; and
    removing the first implant mask and the first sacrificial oxide layer after implanting the conductivity determining ions into the semiconductor substrate.

2. The method of claim 1, wherein forming the first sacrificial oxide layer comprises forming the first sacrificial oxide layer having a thickness of from about 20 to about 30 Angstroms.

3. The method of claim 1, wherein implanting the conductivity determining ions comprises forming source and drain regions in the semiconductor substrate using the gate structure as an ion implantation mask.

4. The method of claim 1, wherein forming the gate electrode structure comprises forming a plurality of gate electrode structures overlying the semiconductor substrate.

5. The method of claim 4, further comprising selectively masking a portion of the gate electrode structures with an epitaxy mask to produce masked gate electrode structures and unmasked gate electrode structures.

6. The method of claim 5, wherein selectively masking a portion of the gate electrode structures produces masked N-type gate electrode structures and unmasked P-type gate electrode structures.

7. The method of claim 6, further comprising etching trenches adjacent the unmasked P-type gate electrode structures and epitaxially growing semiconductor material within the trenches prior to forming the first sacrificial oxide layer overlying the semiconductor substrate.

8. The method of claim 7, further comprising removing the epitaxy mask after epitaxially growing the semiconductor material to expose the masked N-type gate electrode structures prior to forming the first sacrificial oxide layer.

9. The method of claim 4, wherein patterning the first implant mask comprises selectively masking a portion of the gate electrode structures to produce masked gate electrode structures and unmasked gate electrode structures.

10. The method of claim 9, wherein removing the first implant mask and the first sacrificial oxide layer comprises removing the first implant mask and forming an additional implant mask overlying unmasked gate electrode structures left exposed after patterning the first implant mask, prior to removing the first sacrificial oxide layer.

11. The method of claim 10, wherein implanting the conductivity determining ions into the semiconductor substrate comprises selectively implanting conductivity determining ions into the semiconductor substrate at different energy levels for different unmasked gate electrode structures.

12. The method of claim 11, wherein selectively implanting conductivity determining ions into the semiconductor substrate at different energy levels for different unmasked gate electrode structures comprises implanting conductivity determining ions into the semiconductor substrate at a first energy level prior to removing the first implant mask and implanting conductivity determining ions into the semiconductor substrate at a second energy level after removing the first implant mask and after forming the additional implant mask, prior to removing the first sacrificial oxide layer.

13. The method of claim 1, further comprising forming a second sacrificial oxide layer overlying the semiconductor substrate after removing the first sacrificial oxide layer.

14. The method of claim 13, further comprising implanting conductivity determining ions into the semiconductor substrate, through the second sacrificial oxide layer.

15. A method for fabricating an integrated circuit, the method comprising:
    forming a plurality of gate electrode structures overlying a semiconductor substrate;
    forming a first sacrificial oxide layer overlying the semiconductor substrate;
    patterning a first implant mask overlying the first sacrificial oxide layer and a portion of the gate electrode structures to expose a portion of the first sacrificial oxide layer adjacent the gate electrode structures after forming the first sacrificial oxide layer, wherein patterning the first implant mask results in masked gate electrode structures and unmasked gate electrode structures;
    implanting conductivity determining ions into the semiconductor substrate, through the first sacrificial oxide layer;
    removing the first implant mask after implanting the conductivity determining ions into the semiconductor substrate;
    removing the first sacrificial oxide layer after implanting the conductivity determining ions into the semiconductor substrate;
    forming a second sacrificial oxide layer overlying the semiconductor substrate after removing the first sacrificial oxide layer;
    patterning a second implant mask overlying the second sacrificial oxide layer and overlying unmasked gate electrode structures left exposed after patterning the first implant mask;
    implanting conductivity determining ions into the semiconductor substrate, through the second sacrificial oxide layer; and
    patterning an additional implant mask overlying one of the first sacrificial oxide layer or the second sacrificial oxide layer after removing the first implant mask or the second implant mask, wherein the additional implant mask is formed overlying unmasked gate electrode structures left exposed by the first implant mask and the second implant mask.

16. The method of claim 15, wherein implanting conductivity determining ions into the semiconductor substrate, through the first sacrificial oxide layer comprises implanting P-type conductivity determining ions into the semiconductor substrate, and wherein implanting conductivity determining ions into the semiconductor substrate, through the second sacrificial oxide layer comprises implanting N-type conductivity determining ions into the semiconductor substrate.

17. The method of claim 15, further comprising implanting the conductivity determining ions into the semiconductor substrate after patterning the additional implant mask, wherein the conductivity determining ions are implanted at a different energy level than an energy level at which the conductivity determining ions are implanted into the semiconductor substrate prior to removing the first implant mask or the second implant mask.

18. A method for fabricating an integrated circuit, the method comprising:
- forming a plurality of gate electrode structures overlying a semiconductor substrate, wherein the plurality of gate electrode structures comprises N-type gate electrode structures and P-type gate electrode structures;
- selectively masking a portion of the gate electrode structures with an epitaxy mask to produce masked N-type gate electrode structures and unmasked P-type gate electrode structures;
- etching trenches adjacent the unmasked P-type gate electrode structures and epitaxially growing semiconductor material within the trenches;
- removing the epitaxy mask after epitaxially growing the semiconductor material to expose the N-type gate electrode structures;
- forming a first sacrificial oxide layer overlying the semiconductor substrate after removing the epitaxy mask;
- patterning a first implant mask overlying the first sacrificial oxide layer and the N-type gate electrode structures to expose a portion of the first sacrificial oxide layer adjacent the P-type gate electrode structures after forming the first sacrificial oxide layer, wherein patterning the first implant mask produces masked N-type gate electrode structures and unmasked P-type gate electrode structures;
- implanting P-type conductivity determining ions into the semiconductor substrate, through the first sacrificial oxide layer;
- removing the first implant mask after implanting the P-type conductivity determining ions into the semiconductor substrate;
- removing the first sacrificial oxide layer after implanting the P-type conductivity determining ions into the semiconductor substrate;
- forming a second sacrificial oxide layer overlying the semiconductor substrate after removing the first sacrificial oxide layer;
- patterning a second implant mask overlying the second sacrificial oxide layer and overlying unmasked P-type gate electrode structures left exposed after patterning the first implant mask;
- implanting N-type conductivity determining ions into the semiconductor substrate, through the second sacrificial oxide layer.

* * * * *